(12) United States Patent
Kano et al.

(10) Patent No.: US 11,023,069 B2
(45) Date of Patent: Jun. 1, 2021

(54) PRESSURE SENSOR AND ELECTRONIC DEVICE

(71) Applicant: Murata Manufacturing Co., Ltd., Nagaokakyo (JP)

(72) Inventors: Hidekazu Kano, Nagaokakyo (JP); Hiroaki Kitada, Nagaokakyo (JP); Shiori Nagamori, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/592,931

(22) Filed: Oct. 4, 2019

(65) Prior Publication Data
US 2020/0042137 A1 Feb. 6, 2020

Related U.S. Application Data

(63) Continuation of application No. PCT/JP2018/005379, filed on Feb. 16, 2018.

(30) Foreign Application Priority Data

Aug. 21, 2017 (JP) ................. 2017-158373

(51) Int. Cl.
  *G06F 3/041* (2006.01)
  *G01L 9/08* (2006.01)
  *G02B 5/30* (2006.01)

(52) U.S. Cl.
  CPC ........... *G06F 3/0416* (2013.01); *G01L 9/08* (2013.01); *G06F 3/04146* (2019.05); *G02B 5/30* (2013.01)

(58) Field of Classification Search
  CPC .............. G06F 3/0416; G06F 3/04142; G06F 3/04144; G06F 3/04146; G01L 9/06; G01L 9/08

See application file for complete search history.

(56) References Cited

U.S. PATENT DOCUMENTS 9,594,407 B2    3/2017  Takano et al.
2013/0310709 A1* 11/2013 Ko ........................... H04R 1/46
                                                        600/586

(Continued)

FOREIGN PATENT DOCUMENTS

JP    2014215863 A    11/2014
JP    2015049584 A    3/2015

(Continued)

OTHER PUBLICATIONS

International Search Report issued in PCT/JP2018/005379, dated Mar. 4, 2018.

(Continued)

*Primary Examiner* — Robert J Michaud
(74) *Attorney, Agent, or Firm* — Arent Fox LLP

(57) ABSTRACT

A pressure sensor that includes a piezoelectric film having a flat part and a curved part and having opposed first and second main surfaces, a first electrode on the first main surface of the piezoelectric film, and a second electrode on the second main surfaces of the piezoelectric film. When the flat part of the piezoelectric film receives a pressing operation a first output is generated, and when the curved part of the piezoelectric film receives a pressing operation a second output different from the first output is generated.

14 Claims, 11 Drawing Sheets

(56) References Cited

U.S. PATENT DOCUMENTS

| | | | |
|---|---|---|---|
| 2014/0049137 A1* | 2/2014 | Ando | G01B 7/16 |
| | | | 310/330 |
| 2017/0131806 A1 | 5/2017 | Ando et al. | |
| 2017/0336899 A1 | 11/2017 | Szeto | |
| 2018/0040803 A1* | 2/2018 | Park | G06F 1/1652 |

FOREIGN PATENT DOCUMENTS

| | | |
|---|---|---|
| JP | 2015057822 A | 3/2015 |
| WO | 2016027818 A1 | 2/2016 |
| WO | 2016065482 A1 | 5/2016 |

OTHER PUBLICATIONS

Written Opinion of the International Searching Authority issued in PCT/JP2018/005379, dated Mar. 4, 2018.

* cited by examiner

PRESSURE SENSOR AND ELECTRONIC DEVICE

CROSS REFERENCE TO RELATED APPLICATIONS

The present application is a continuation of International application No. PCT/JP2018/005379, filed Feb. 16, 2018, which claims priority to Japanese Patent Application No. 2017-158373, filed Aug. 21, 2017, the entire contents of each of which are incorporated herein by reference.

FIELD OF THE INVENTION

The present invention relates to a pressure sensor used for a curved display.

BACKGROUND OF THE INVENTION

Patent Document 1 discloses an electronic device including a touch panel layer and a pressure sensor. In the electronic device disclosed in Patent Document 1, the pressure sensor is disposed to overlap the touch panel layer to detect a distortion of a protection glass of the electronic device.

Patent Document 1: Japanese Patent Application Laid-Open No. 2014-215863

SUMMARY OF THE INVENTION

In a terminal like the electronic device described in Patent Document 1, an operation surface is formed to have a flat shape. For example, as in an electronic device 700 illustrated in FIG. 7(A), a touch panel 63 disposed on a front surface has a flat configuration. A terminal like the electronic device 700 usually includes a physical switch 64 for various purposes such as power, on a side surface of a housing 62. As the electronic device 700 becomes more flexible, an electronic device 701 having a rounded edge design, as illustrated in FIG. 7(B), has been more widely used. For the electronic device 701, it is required to narrow the width in a thickness direction of a housing 72 at a side surface of the terminal in order to provide roundness at a terminal edge without an increase in thickness. For this reason, there is little space on the side surface of the housing of the terminal to form a physical switch 74 that receives a pressing operation. As a result, the physical switch 74 may not be formed.

Therefore, the present invention provides a pressure sensor that can detect a pressing operation received at a position other than a front surface of a touch panel without forming a physical switch.

A pressure sensor of the present invention includes a piezoelectric film having a flat part and a curved part and having opposed first and second main surfaces, a first electrode on the first main surface of the piezoelectric film, and a second electrode on the second main surfaces of the piezoelectric film, wherein, when the flat part receives a pressing operation a first output is generated, and when the curved part receives a pressing operation a second output different from the first output is generated.

The piezoelectric film is attached continuously over a flat part and a curved part of a panel on a housing of an electronic device. When the flat part of the panel receives a pressing operation, the piezoelectric film is deformed inward according to the deformation of the flat part of the panel. On the other hand, when the housing connected to the curved part receives the pressing operation, the housing is deformed inward, and the curved part connected to the housing and the flat part are deformed to project outward. Accordingly, the piezoelectric film is deformed to project outward. In this manner, the piezoelectric film is deformed differently between when the flat part receives the pressing operation and when the housing receives the pressing operation, and thus the piezoelectric film provides different outputs between both cases. Thus, the pressing operation that is received at a position other than the flat part of the panel can be detected.

The electronic device according to the present invention includes the pressure sensor.

In this configuration, the pressure sensor makes it possible to detect the pressing operation that is received at a position other than the flat part of the panel.

According to the present invention, it is possible to detect a pressing operation that is received at a position other than a touch panel without forming a physical switch.

DETAILED DESCRIPTION OF THE INVENTION

Figure 1A:
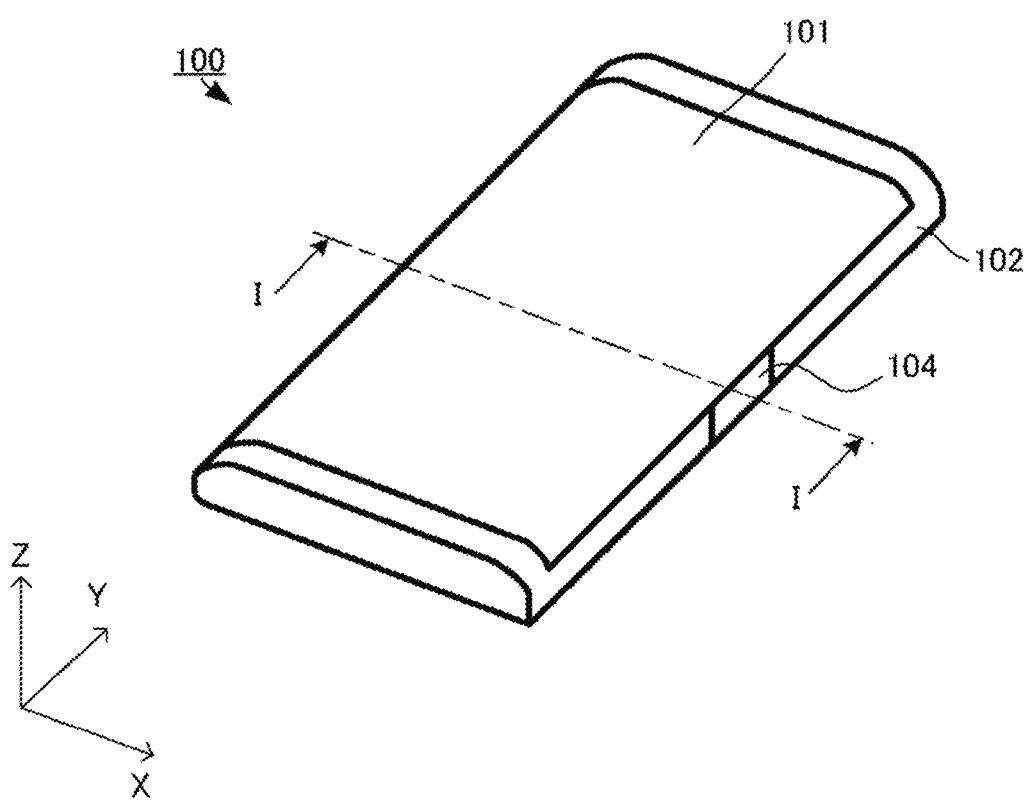
FIG. 1(A) is a perspective view of an electronic device provided with a pressure sensor according to a first embodiment.
Figure 1B:
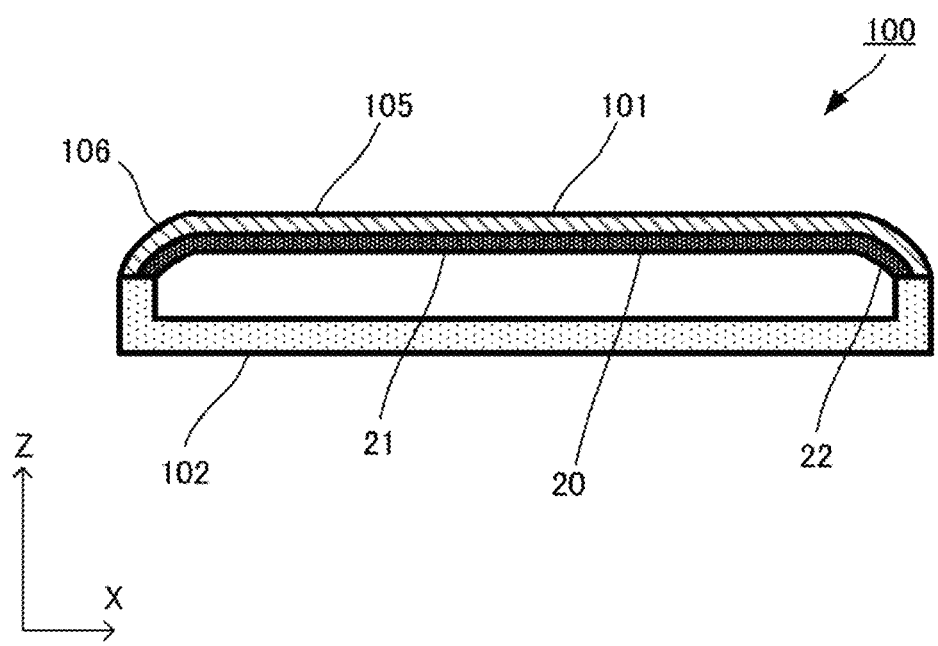
FIG. 1(B) is a cross-sectional view thereof.

FIG. 1(A) is a perspective view of an electronic device provided with a pressure sensor according to a first embodiment, and FIG. 1(B) is a schematic cross-sectional view taken along I-I line illustrated in FIG. 1(A). Note that the electronic device or the pressure sensor as illustrated in each drawing is an example and is not particularly limited, but can be modified in accordance with specifications. Moreover, wiring and the like in each drawing are omitted for the sake of description.

As illustrated in FIGS. 1(A) and 1(B), an electronic device 100 includes a substantially rectangular parallelepiped housing 102 with an opened upper surface. The upper surface of the electronic device 100 is partially curved as described below. The electronic device 100 includes a partially curved flat front panel 101 that is disposed to seal the opening of the upper surface of the housing 102. The front panel 101 is a touch panel that functions as an operation surface on which a user performs a touch operation using a finger, a pen, etc. The front panel 101 corresponds to the "panel" in the following description. In the following description, a width direction (lateral direction), a length direction (longitudinal direction), and a thickness direction of the housing 102 correspond to an X direction, a Y direction, and a Z direction, respectively.

The electronic device 100 includes a pressure sensor 20 inside the housing 102. The pressure sensor 20 is attached on the inner side of the front panel 101. Therefore, the pressure sensor 20 can detect a pressing operation received on the front panel 101.

The front panel 101 has a flat part 105 and a curved part 106. The flat part 105 is on an upper surface side of the electronic device 100 that is a positive direction of the Z-axis. The curved part 106 is disposed continuously on each end of the flat part 105 in the X-axis direction. The housing 102 is connected to the curved part 106 of the front panel 101. The curved part 106 has a shape curving outward of the electronic device 100. The flat part 105 does not necessarily need to be strictly flat, but may be curved to some extent. In addition, the whole shape of the electronic device 100, including a cover member, may be cylindrical.

The pressure sensor 20 is attached continuously over the flat part 105 and the curved part 106. For this reason, the pressure sensor 20 includes a flat part 21 and a curved part 22 in the same manner as the front panel 101. As a result, the pressure sensor 20 has a shape curving outward of the electronic device 100 as a whole.

The electronic device 100 may include a display unit, not illustrated in the drawings. The display unit is disposed to be laminated on the front panel 101 and the pressure sensor 20. If the display unit is formed in the electronic device 100 inward from the front panel 101 and the pressure sensor 20, the pressure sensor 20 is formed of a translucent material.

The housing 102 is formed of a material having a certain degree of flexibility. For this reason, when a side area 104 of the housing 102 receives the pressing operation, the housing 102 is deformed to a certain degree and the deformation of the housing 102 can be transmitted to the front panel 101. As described below, the pressure sensor 20 outputs a potential according to pressing force transmitted from the housing 102 to the front panel 101.

Moreover, the pressure sensor 20 is connected to a power supply unit, not illustrated in the drawings, and the supply of power is controlled either by turning on or off the power supply unit. A known power supply source is adopted; for example, a dry battery, a domestic power source, or a solar battery can be used.

Figure 2A:
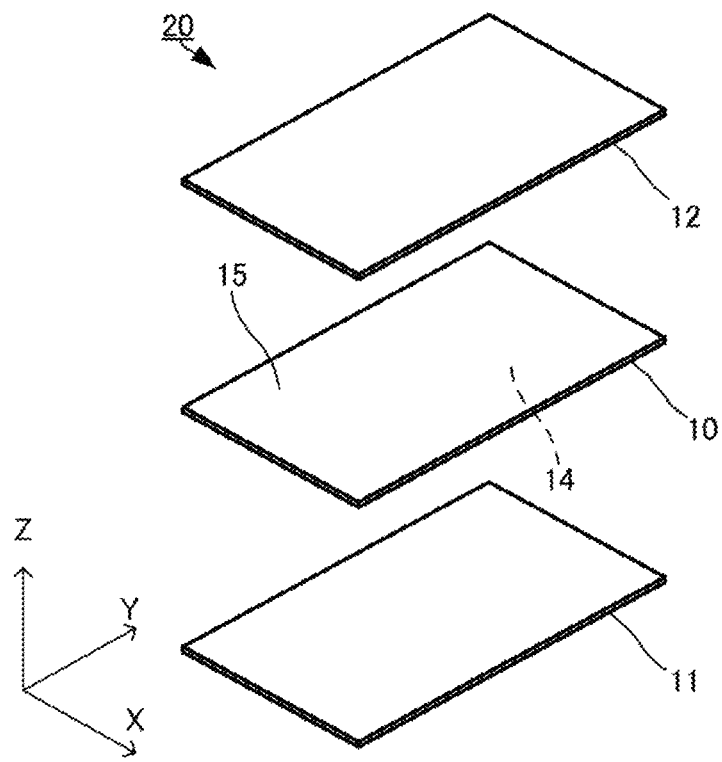
FIG. 2(A) is a partially exploded perspective view of the pressure sensor according to the first embodiment.
Figure 2B:
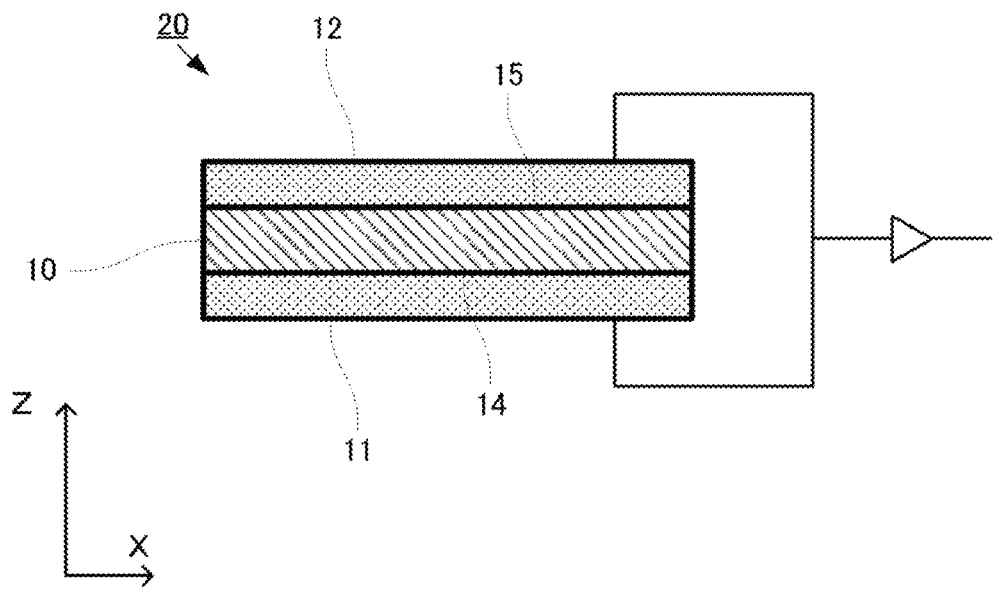
FIG. 2(B) is a schematic cross-sectional view thereof.

FIG. 2(A) is a partially exploded perspective view of the pressure sensor according to the first embodiment, and FIG. 2(B) is a schematic cross-sectional view thereof. Wiring and the like extended from an electrode or the like in FIG. 2(A) are omitted. For the sake of description, a piezoelectric film 10, a first electrode 11, and a second electrode 12 are each illustrated as a flat surface in FIGS. 2(A) and 2(B), but are actually curved at both ends in the X direction.

As illustrated in FIGS. 2(A) and 2(B), the pressure sensor 20 includes the piezoelectric film 10, the first electrode 11, and the second electrode 12. The piezoelectric film 10 has a first main surface 14 and a second main surface 15.

The first electrode 11 is provided on the first main surface 14 of the piezoelectric film 10, and the second electrode 12 is provided on the second main surface 15 of the piezoelectric film 10. Since the pressure sensor 20 can be formed of one rectangular sheet that is a laminate of the piezoelectric film 10, the first electrode 11, and the second electrode 12, it is easy to manufacture the pressure sensor 20. The shape of the pressure sensor 20 is not limited to rectangular, and can be designed according to a shape of the electronic device 100, such as an elliptic shape or a square shape.

The first electrode 11 is a GND electrode, and the second electrode 12 may be a signal electrode. Examples of the first electrode 11 and the second electrode 12 include an inorganic electrode such as ITO, ZnO, a silver nanowire, a carbon nanotube, and graphene, and an organic electrode mainly containing polythiophene or polyaniline. The GND electrode and the signal electrode can be made transparent electrodes with these materials.

When a transparent material is used as the piezoelectric film 10, the transparency of the pressure sensor 20 is increased. Therefore, a visibility of internal components of the electronic device 100, such as a display unit not illustrated in the drawings, through the pressure sensor 20 can be improved. The piezoelectric film 10 does not necessarily need to be transparent, but materials such as silver, copper, and aluminum may be used for the piezoelectric film 10.

Figure 3:
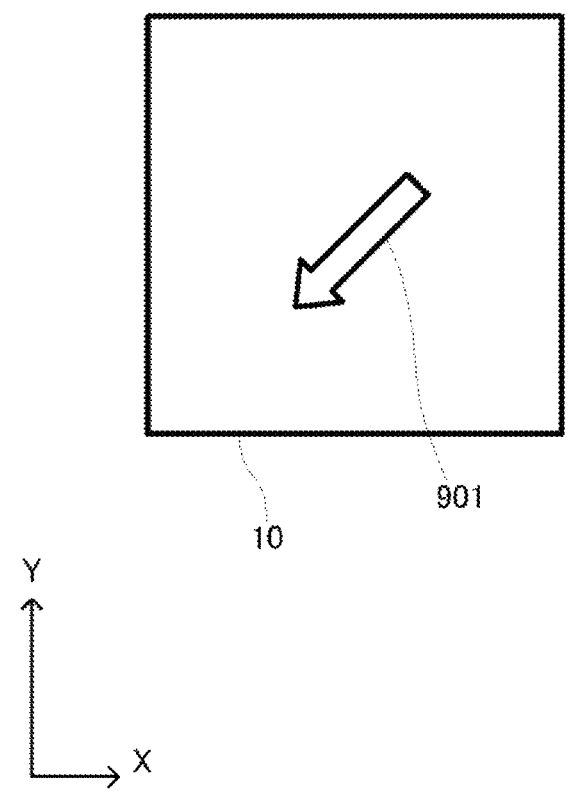
FIG. 3 is a schematic view for explaining a piezoelectric element according to the first embodiment.

FIG. 3 is a schematic view for explaining a piezoelectric element according to the first embodiment. The piezoelectric film 10 only needs to be a film with piezoelectricity, and preferably includes a chiral polymer. Examples of the chiral polymer include uniaxially stretched polylactic acid (PLA) and poly-L-lactic acid (PLLA).

As illustrated in FIG. 3, in this embodiment, the piezoelectric film 10 is formed of uniaxially stretched poly-L-lactic acid (PLLA). The piezoelectric film 10 is uniaxially stretched almost along a diagonal line of the rectangle (refer to 901 in FIG. 3).

The direction is hereinafter referred to as a uniaxial stretching direction 901. The uniaxial stretching direction 901 preferably forms an angle of 45° with respect to the axis direction or the lateral direction of the piezoelectric film 10. The angle is not limited to 45°, but may be appropriately designed in view of a characteristic or usage of the piezoelectric film 10. For example, the uniaxial stretching direction only needs to form an angle of 45° with respect to the curved direction.

The uniaxial stretching direction is not exactly limited to 45°, but may be substantially 45°. The "substantially 45°" includes an angle of, for example, about 45°±10°. Based on the usage of the pressure sensor 20, the angle is appropriately determined in accordance with the whole design such as detection accuracy. The uniaxial stretching direction is not limited to substantially 45°, but any angle can be adopted in the present invention as long as a deformation can be detected.

The PLLA described above is a chiral polymer whose main chain has a helical structure. The PLLA has piezoelectricity by being stretched uniaxially and by molecules being oriented. The uniaxially stretched PLLA generates charges when a planar surface of the piezoelectric film 10 is deformed. At this time, the amount of charges generated is uniquely determined according to a displacement amount of the planar surface that is displaced by being pressed in a direction orthogonal to the planar surface. A piezoelectric constant of the uniaxially stretched PLLA is extremely high among polymers.

Therefore, the deformation transmitted to the piezoelectric film 10 can be detected reliably with high sensitivity using the PLLA. That is, the deformation applied on the piezoelectric film 10 can be detected reliably.

A preferable stretch ratio is about three to eight times. With heat treatment applied after stretching, crystallization of extended chain crystals of polylactic acid is promoted, and the piezoelectric constant is improved. In the case of biaxial stretching, the same effect as the uniaxial stretching can be obtained by differentiating stretch ratios of both directions. For example, when the piezoelectric film 10 is stretched eight times in a direction as an X-axis and two times in a Y-axis direction orthogonal to the X-axis direction, an effect equivalent to that of a case where the piezoelectric film 10 is stretched four times in the X-axis direction can be obtained for the piezoelectric constant. Since a simply uniaxially stretched film easily tears in the stretching direction, the strength can be increased slightly by the biaxial stretching as described above.

Since the PLLA has piezoelectricity through orientation of molecules caused by stretching or the like, poling treatment is not required for the PLLA unlike other polymers such as PVDF or piezoelectric ceramics. That is, the piezoelectricity of the PLLA, which does not belong to the ferroelectric, is not expressed by the polarization of ions unlike the ferroelectric such as the PVDF or PZT, but derived from a characteristic helical structure of molecules.

For this reason, the pyroelectricity generated in other piezoelectric bodies of ferroelectricity is not generated in the PLLA. Therefore, the PLLA is suitable for things that are touched by a living body. Furthermore, the variation of the piezoelectric constant is observed in the PVDF or the like with time and the piezoelectric constant may be significantly reduced in some cases, but the piezoelectric constant of the PLLA is very stable with time. Thus, the deformation of the piezoelectric film 10 can be detected with high sensitivity without being affected by a surrounding environment. Problems may occur if a piezoelectric film having pyroelectricity such as the PVDF is used in place of the PLLA. For example, the deformation is not detected unless the piezoelectric film is strongly gripped, or the deformation is detected even with a slight contact, depending on the temperature of surroundings. The PVDF can be used in the case of applying a sensor (with low sensitivity) with the specifications having no problem even when being influenced by the surrounding environment. The PVDF can also be used if an ambient temperature sensor is separately provided to perform control to change the sensitivity of a piezoelectric element according to the ambient temperature. However, a system can be more simplified by using the PLLA. The piezoelectric film 10 is not limited to a piezoelectric film using the PLLA or the PVDF. For example, the piezoelectric film 10 only needs to provide outputs with different polarities between when applying a pressing force from the first main surface of the piezoelectric film 10 and when applying a pressing force from the second main surface of the piezoelectric film 10.

The piezoelectric element may have a laminate structure that includes the first electrode 11, the piezoelectric film 10, the second electrode 12 as well as an insulation film and a third electrode, not illustrated in the drawings. In this case, the first electrode 11 and the third electrode are the GND electrodes, and the second electrode 12 is the signal electrode. In this piezoelectric element, the GND electrodes (the first electrode 11 and the third electrode) are disposed to cover the second electrode 12 as the signal electrode, and therefore a malfunction due to noise generated from a hand or a peripheral device can be reduced. The insulation film may be a PET film or a polyimide film. A plurality of piezoelectric films may be laminated in order to enhance the sensitivity. Furthermore, various deformations can be detected with the plurality of piezoelectric films laminated in different uniaxial stretching directions of the PLLA.

Figure 4A:
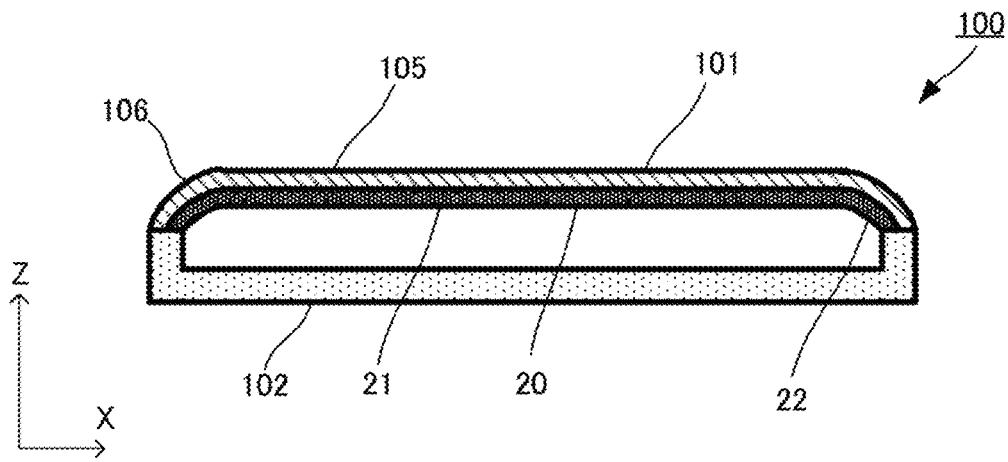
FIG. 4(A) is a schematic cross-sectional view for explaining the electronic device according to the first embodiment that has not received a pressing operation.
Figure 4B:
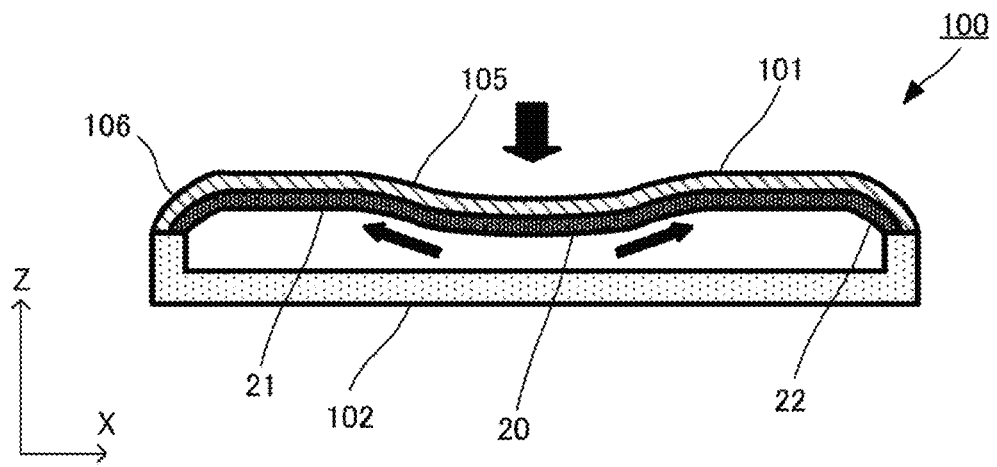
FIG. 4(B) is a schematic cross-sectional view for explaining the electronic device according to the first embodiment that is receiving a pressing operation on a touch panel.
Figure 4C:
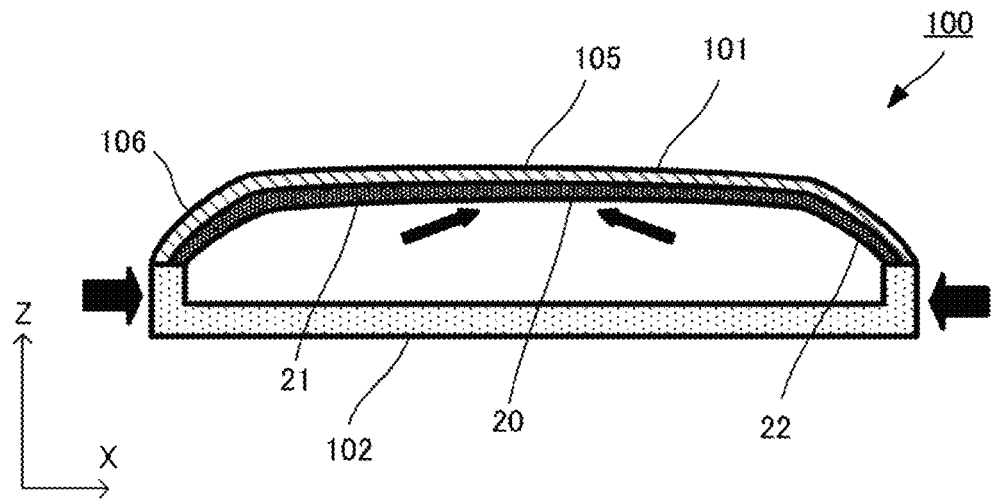
FIG. 4(C) is a schematic cross-sectional view for explaining the electronic device according to the first embodiment that is receiving a pressing operation on a side part.

FIG. 4(A) is a schematic cross-sectional view for explaining the electronic device according to the first embodiment that has not received a pressing operation. FIG. 4(B) is a schematic cross-sectional view for explaining the electronic device according to the first embodiment that is receiving a pressing operation on a front panel. FIG. 4(C) is a schematic cross-sectional view for explaining the electronic device according to the first embodiment that is receiving a pressing operation on a side part.

As illustrated in FIG. 4(A), when the electronic device 100 is not receiving the pressing operation, the front panel 101 is shaped to curve outward of the electronic device 100 as a whole. The pressure sensor 20 is shaped to curve outward of the electronic device 100 as a whole along the front panel 101. In this state, charge is not generated since the piezoelectric film 10 of the pressure sensor 20 is not deformed.

As illustrated in FIG. 4(B), when the flat part 105 of the front panel 101 receives the pressing operation, the flat part 105 is deformed in a negative direction of the Z-axis, that is, deformed inward of the electronic device 100. Due to the deformation of the front panel 101, the pressing force is transmitted to the piezoelectric film 10 of the pressure sensor 20. The piezoelectric film 10 is deformed in the negative direction of the Z-axis. As a result, the piezoelectric film 10 generates charges by being stretched in the X-axis direction. Thus, the piezoelectric film 10 outputs a potential according to the operation received on the flat part 105 of the front panel 101.

As illustrated in FIG. 4(C), when the housing 102 of the electronic device 100 receives the pressing operation, the housing 102 is deformed to shrink in the X-axis direction. This corresponds to a case where, for example, the predetermined area 104 of the side part illustrated in FIG. 1(B) is pressed. The area 104 is not limited to the predetermined area 104, but may be any area as long as the area is on both ends of the housing 102 of the electronic device 100 in the X-axis direction.

Due to the deformation of the housing 102, the front panel 101 shrinks in the X-axis direction, and thus the front panel 101 is deformed in a positive direction of the Z-axis, that is, deformed outward of the electronic device 100. Due to the deformation of the front panel 101, the pressing force is transmitted to the piezoelectric film 10 of the pressure sensor 20. The piezoelectric film 10 is deformed in the positive direction of the Z-axis. As a result, the piezoelectric film 10 generates charges by shrinking in the X-axis direction. Thus, the piezoelectric film 10 outputs the potential according to the operation received on the housing 102.

As described above, the piezoelectric film 10 is deformed differently between when receiving the pressing operation on the flat part 105 of the front panel 101 and when receiving the pressing operation on the housing 102. Thus, the piezoelectric film 10 can provided a different output according to each status. For example, when the flat part 105 of the front panel 101 receives the pressing operation, the piezoelectric film 10 can output a positive charge, and when the housing 102 receives the pressing operation, the piezoelectric film 10 can output a negative charge having the opposite polarity to the positive charge. This makes it possible to detect the pressing operation that is received at a position other than the front panel 101 without forming a physical switch on the electronic device 100.

Figure 5A:
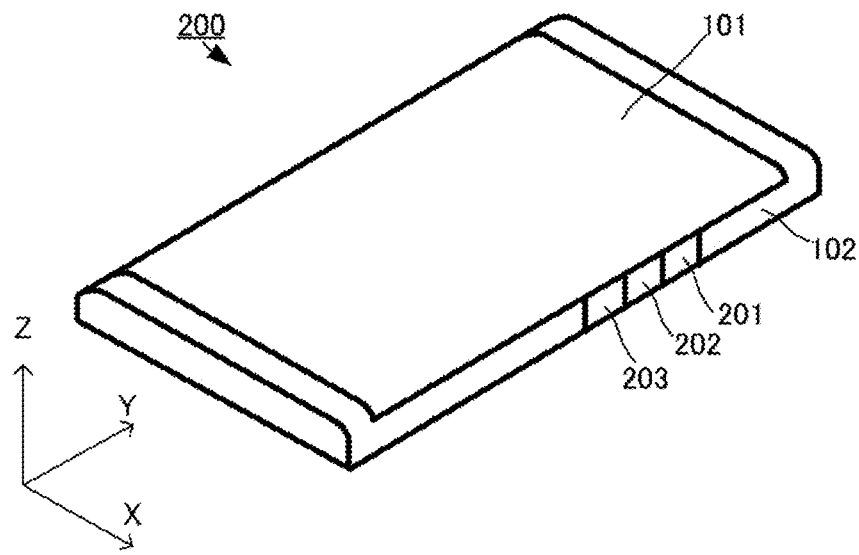
FIG. 5(A) is a perspective view of an electronic device provided with a pressure sensor according to a second embodiment.
Figure 5B:
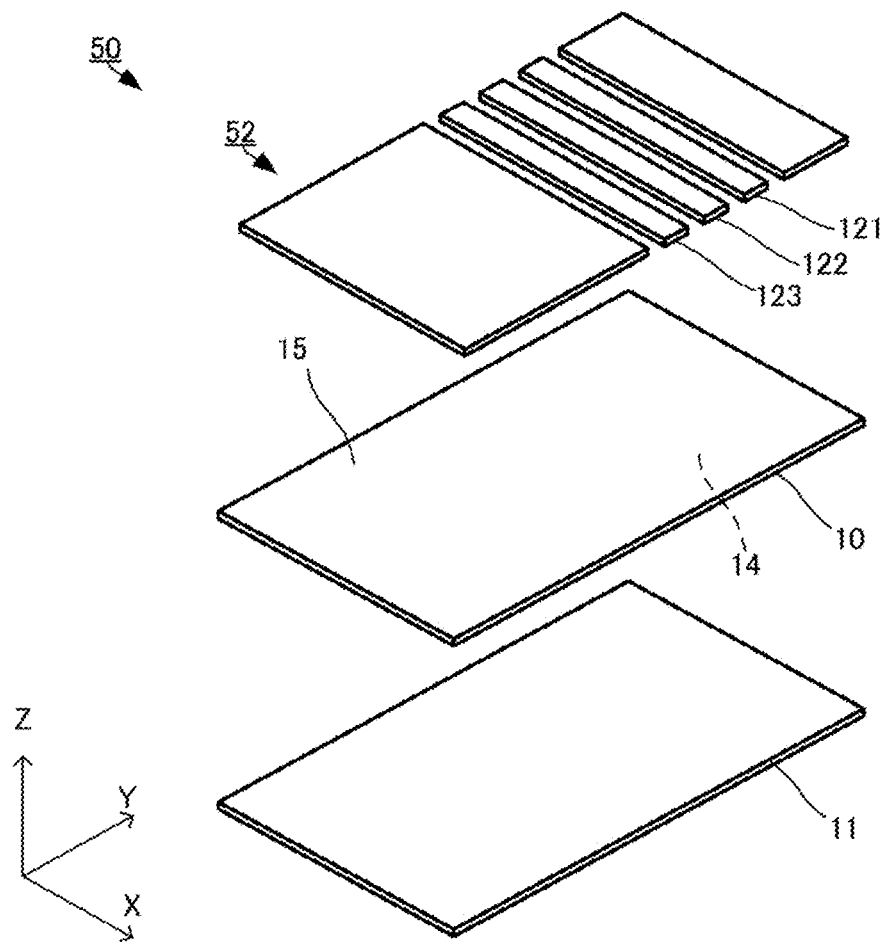
FIG. 5(B) is a partially exploded perspective view of the pressure sensor according to the second embodiment.

FIG. 5(A) is a perspective view of an electronic device provided with a pressure sensor according to a second embodiment, and FIG. 5(B) is a partially exploded perspective view of the pressure sensor according to the second embodiment. A description of the same structure described in the first embodiment is omitted in the second embodiment.

As illustrated in FIG. 5(A), an electronic device 200 is provided with a first area 201, a second area 202, and a third area 203 on a side part of a housing 102. The first area 201, the second area 202, and the third area 203 are provided continuously in this embodiment, but the arrangement, number, and the like of the areas may be appropriately set according to a usage condition.

As illustrated in FIG. 5(B), the electronic device 200 incudes a pressure sensor 50. The pressure sensor 50 incudes a piezoelectric film 10, a first electrode 11, and a plurality of second electrodes 52. The plurality of second electrodes 52 is formed along the Y-axis direction. The second electrodes 52 include an electrode 121 for a first area 201, an electrode 122 for a second area 202, and an electrode 123 for a third area 203. The electrode 121 for the first area, the electrode 122 for the second area, and the electrode 123 for the third area are arranged along the Y-axis direction at positions corresponding to the first area 201, the second area 202, and the third area 203 of the housing 102, respectively.

When the first area 201 on the housing 102 of the electronic device 200 receives a pressing operation, the housing 102 is deformed to shrink in the X-axis direction. At this time, due to the deformation of the housing 102, a front panel 101 is deformed and the piezoelectric film 10 generates charges by shrinking in the X-axis direction. At this time, the front panel 101 is deformed, and the vicinity of the first area 201 that has received the pressing operation is most largely deformed. As a result, the piezoelectric film 10 is most largely deformed around the first area 201. Among the electrodes 121, 122, and 123, a charge output from the electrode 121 for the first area 201 becomes largest. Therefore, the outputs of the pressure sensor 50 differ among the electrodes 121, 122, and 123, making it possible to detect the reception of the pressing operation on the first area 201 of the electronic device 200 by comparing outputs from the electrodes 121, 122, and 123. Accordingly, pressing of a predetermined position can be detected without providing a physical switch on the predetermined position.

Figure 6A:
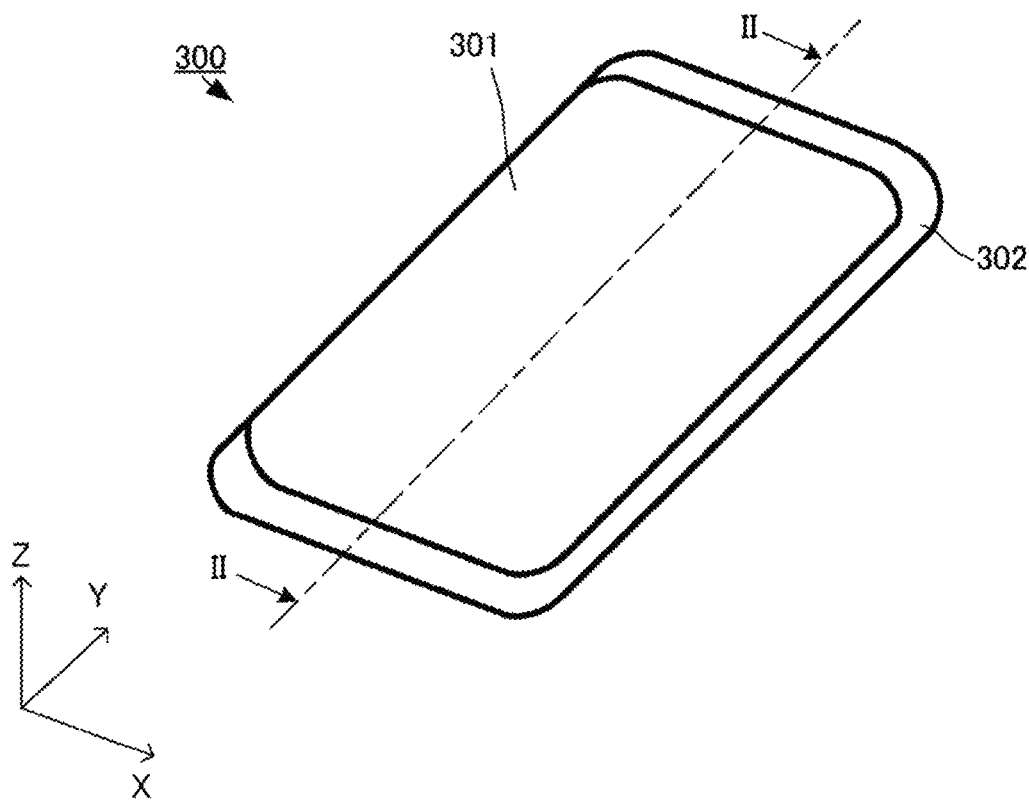
FIG. 6(A) is a perspective view of an electronic device provided with a pressure sensor according to a third embodiment.
Figure 6B:
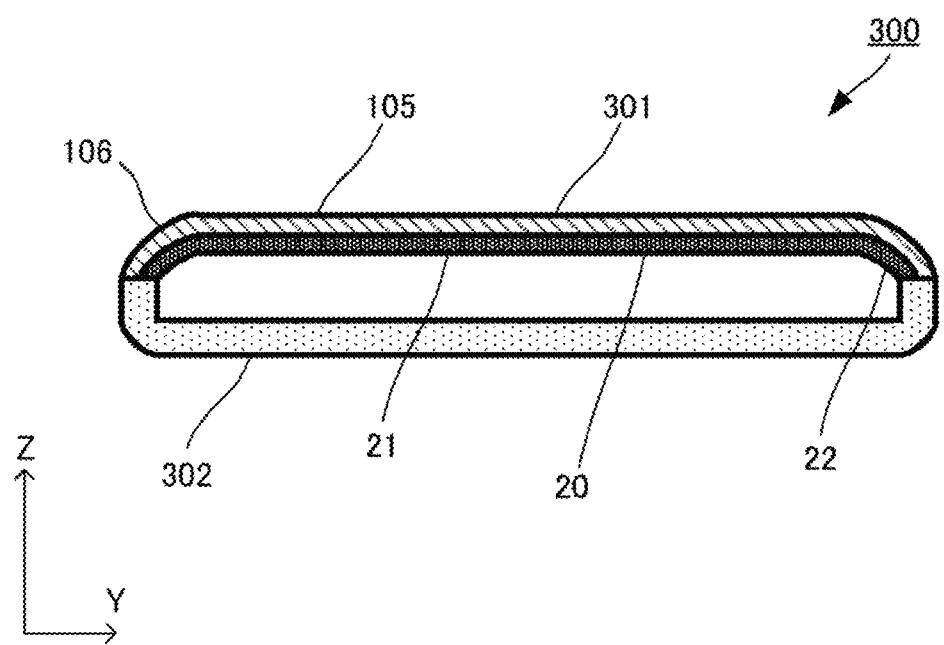
FIG. 6(B) is a cross-sectional view thereof.
Figure 7A:
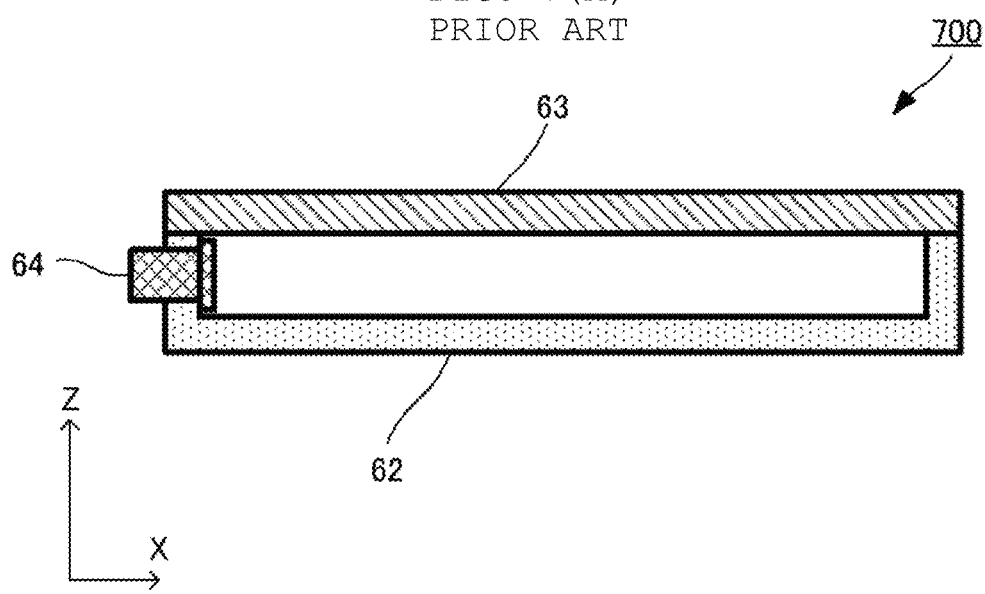
FIGS. 7(A) and 7(B) are drawings for explaining an electronic device provided with a conventional pressure sensor.
Figure 7B:
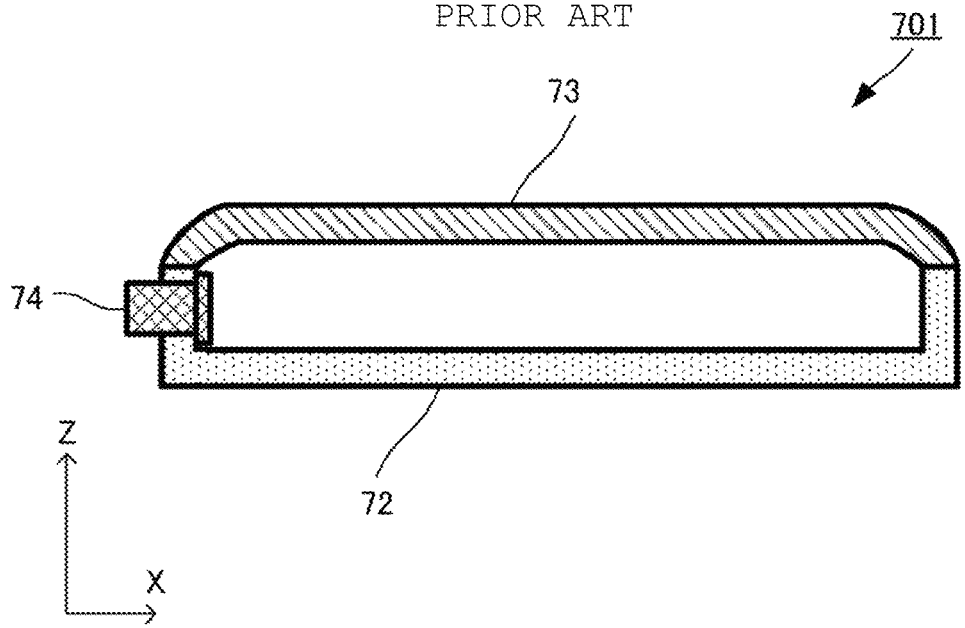

FIG. 6(A) is a perspective view of an electronic device provided with a pressure sensor according to a third embodiment. FIG. 6(B) is a schematic cross-sectional view taken along II-II line illustrated in FIG. 6(A). A description of the same structure described in the first embodiment is omitted in the third embodiment.

As illustrated in FIGS. 6(A) and 6(B), shapes of a front panel 301 and a housing 302 of an electronic device 300 are different from those of the front panel 101 and the housing 102, respectively. The front panel 301 also has a curved part 106 on each end in the Y-axis direction. The curved part 106 is disposed continuously around a flat part 105 of the electronic device 300. For this reason, a pressing operation can be detected by the electronic device 300, when the housing 302 receives the pressing operation not only in the X-axis direction but also in the Y-axis direction.

Figure 8A:
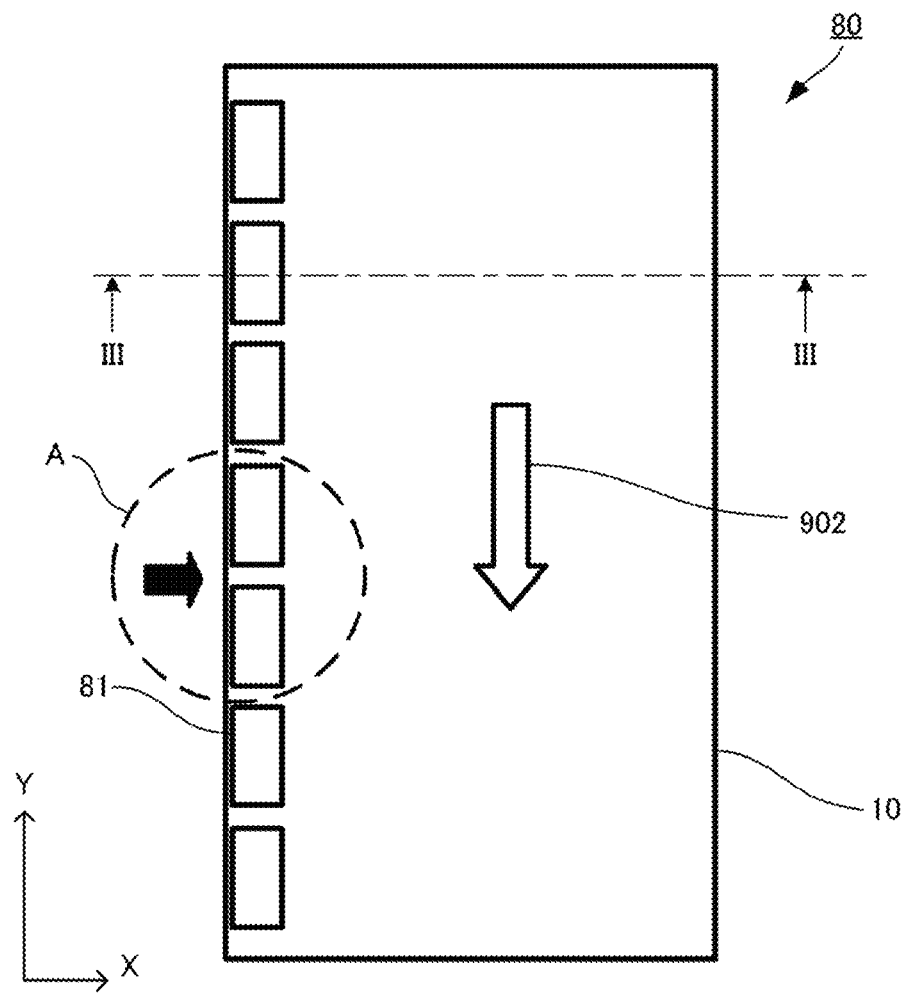
FIG. 8(A) is a schematic plan view for explaining a pressure sensor according to a fourth embodiment.
Figure 8B:
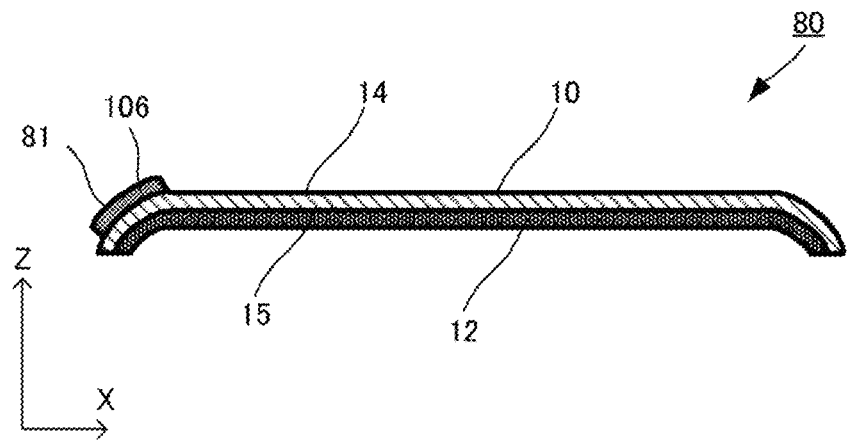
FIG. 8(B) is a cross-sectional view thereof.
Figure 9:
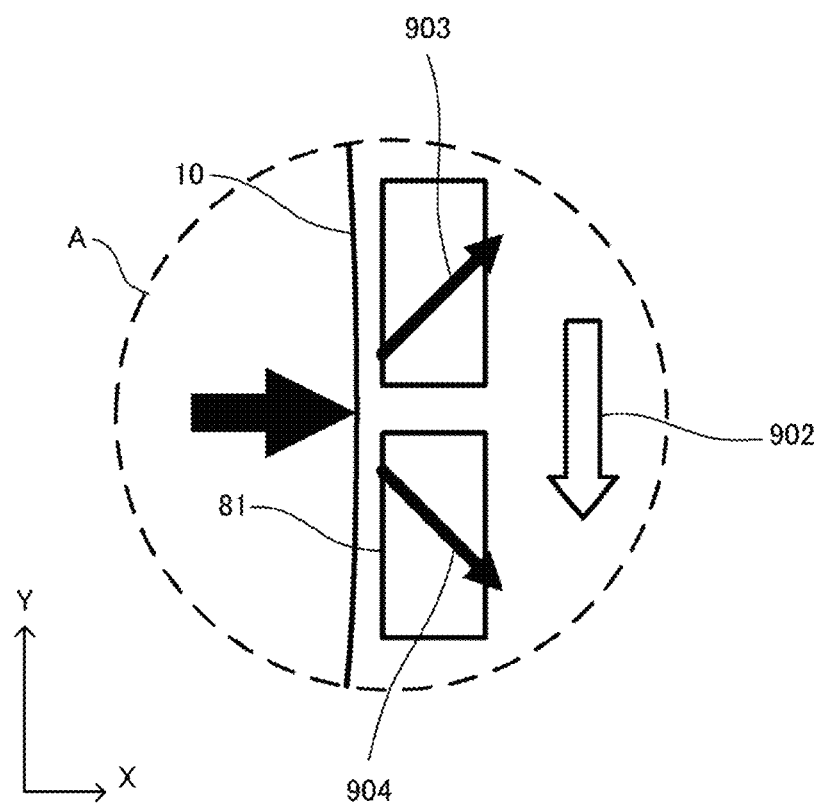
FIG. 9 is a partially enlarged view for explaining the pressure sensor according to the fourth embodiment.

FIG. 8(A) is a schematic plan view for explaining a pressure sensor according to a fourth embodiment. FIG. 8(B) is a schematic cross-sectional view taken along III-III line illustrated in FIG. 8(A). FIG. 9 is an enlarged view of an area surrounded by a dashed line A for explaining the pressure sensor according to the fourth embodiment. A description of the same structure described in the first embodiment is omitted in the fourth embodiment.

As illustrated in FIGS. 8(A) and 8(B), a pressure sensor 80 according to the fourth embodiment includes a piezoelectric film 10, a second electrode 12, and a plurality of first electrodes 81. The first electrodes 81 are provided on a curved part 106 as a first main surface 14 of the piezoelectric film 10. The first electrodes 81 are rectangular and arranged along the Y-axis direction. The piezoelectric film 10 or the first electrodes 81 may be provided at any position to which a deformation caused by a pressing operation on the curved part 106 can be transmitted.

As illustrated in FIG. 8(A), the piezoelectric film 10 is uniaxially stretched almost along the Y-axis direction on the pressure sensor 80 (refer to 902 in FIG. 8(A)). The direction is hereinafter referred to as a uniaxial stretching direction 902. It is preferable that the uniaxial stretching direction 902 be parallel to the Y-axis direction (longitudinal direction) or the X-axis direction (lateral direction) of the piezoelectric film 10.

As illustrated by the bold arrow in FIG. 8(A), when the pressure sensor 80 is pressed in a direction perpendicular to the longitudinal direction of the piezoelectric film 10, as illustrated FIG. 9, the piezoelectric film 10 is deformed symmetrically with the pressed position as a center of the deformation. When the pressed position is located between adjacent first electrodes 81, for example, a stress on the piezoelectric film 10 is generated as illustrated by the arrows 903 and 904 in FIG. 9. The arrow 903 is at −45° relative to the uniaxial stretching direction 902 of the piezoelectric film 10, and the arrow 904 is at 45° relative to the uniaxial stretching direction 902 of the piezoelectric film 10. For this reason, the first electrodes 81 output charges having reverse polarities symmetrically with the pressed position as a center. This makes it possible to specify the position that has received the pressing operation, just by detecting the polarity of the output from each first electrode 81.

The number of the first electrodes 81 may be appropriately designed in accordance with the number of buttons configured on the side surface. For example, if three side buttons are arranged on the side surface, at least two first electrodes 81 need to be arranged. More first electrodes 81 may be arranged in order to accurately detect the pressed position.

Figure 10A:
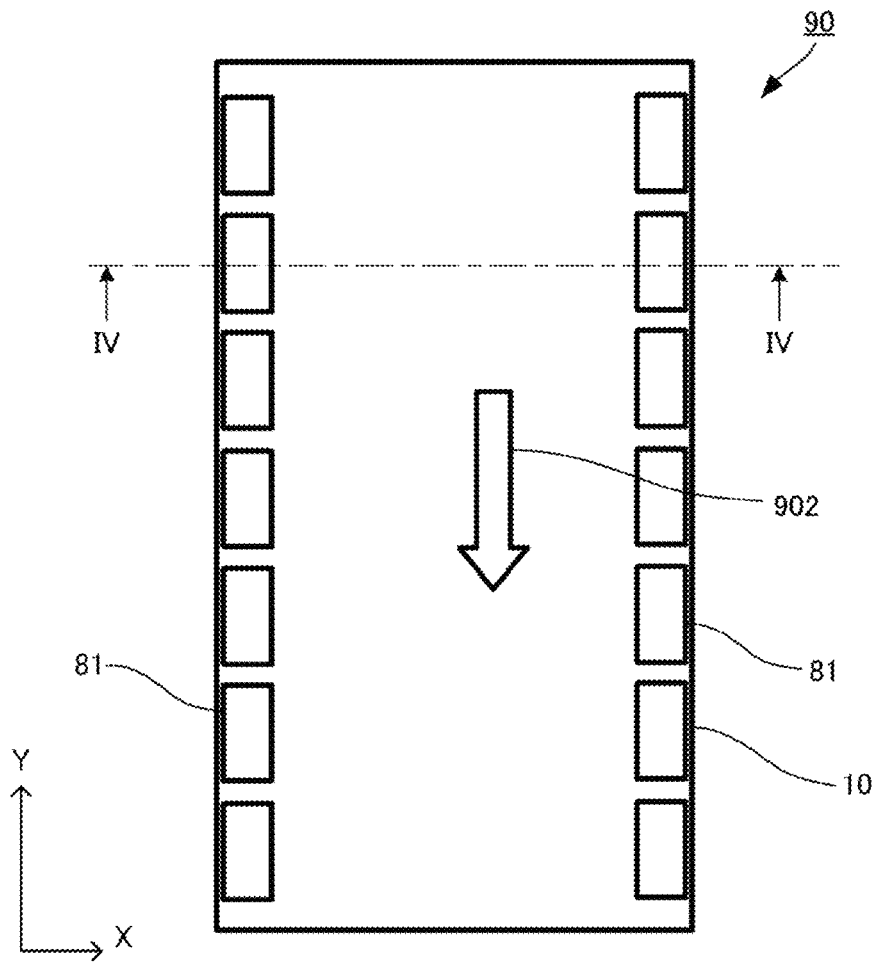
FIG. 10(A) is a schematic plan view for explaining a pressure sensor according to a fifth embodiment.
Figure 10B:
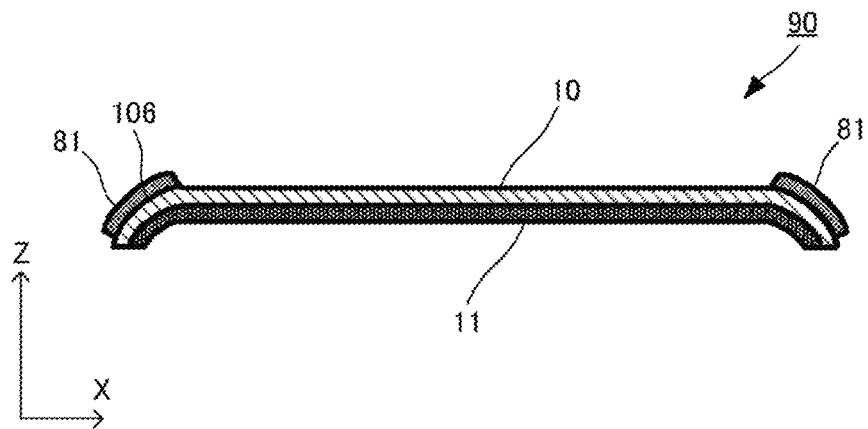
FIG. 10(B) is a cross-sectional view thereof.

FIG. 10(A) is a schematic plan view for explaining a pressure sensor according to a fifth embodiment, and FIG. 10(B) is a schematic cross-sectional view taken along IV-IV line illustrated in FIG. 10(A). A description of the same structure described in the fourth embodiment is omitted in the fifth embodiment.

As illustrated in FIGS. 10(A) and 10(B), a pressure sensor 90 according to the fifth embodiment includes a plurality of first electrodes 81 in the same manner as the fourth embodiment. The first electrodes 81 are provided on a whole curved part 106 as a first main surface 14 of a piezoelectric film 10. In other words, the plurality of first electrodes 81 is provided along the long sides of the piezoelectric film 10. Therefore, the pressure sensor 90 can specify any position of the curved part 106 that has received the pressing operation.

Figure 11:
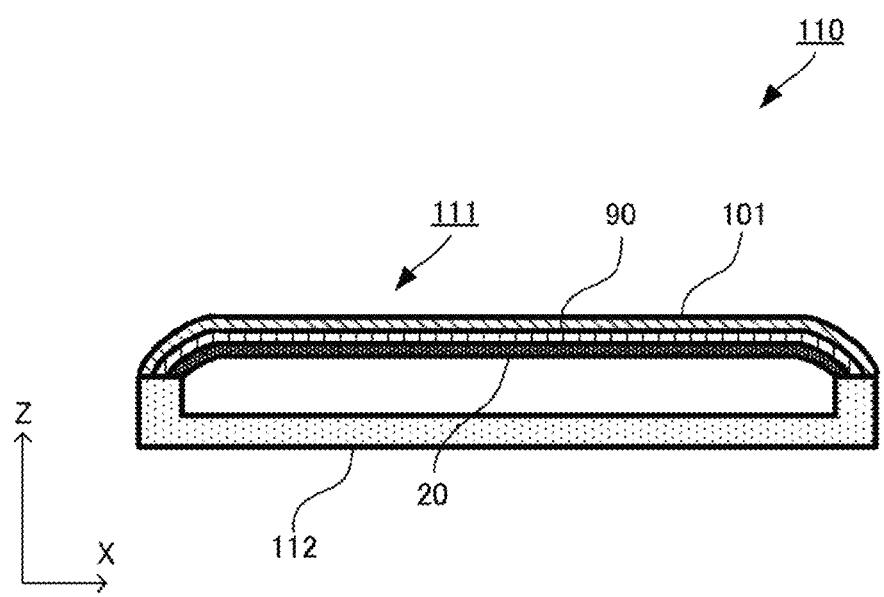
FIG. 11 is a cross-sectional view of an electronic device provided with a pressure sensor according to a sixth embodiment.

FIG. 11 is a cross-sectional view of an electronic device provided with a pressure sensor according to a sixth embodiment. A description of the same structure described in the first embodiment is omitted in the sixth embodiment.

As illustrated in FIG. 11, an electronic device 110 according to the sixth embodiment includes a sensor part 111. The sensor part 111 includes a pressure sensor 20 and a capacitance sensor 90. The capacitance sensor 90 is film-shaped like the pressure sensor 20, and is formed as the integral sensor part 111. Thus, the capacitance sensor 90 can be attached along a curved shape such as the shape of a front panel 101.

The capacitance sensor 90 is disposed between the front panel 101 and the pressure sensor 20, but the pressure sensor 20 may alternatively be disposed between the front panel 101 and the capacitance sensor 90. If the capacitance sensor 90 is configured inward from the pressure sensor 20, the pressure sensor 20 can be disposed easily.

The capacitance sensor 90 detects a touch position in the electronic device 110. The pressure sensor 20 detects pressing information. For this reason, the pressure sensor 20 just needs to have a function of detecting the presence of the pressing operation. Therefore, even in the case of arranging a plurality of side buttons, for example, a complicated structure including a plurality of electrodes is not necessary unlike in the second or fourth embodiment. This simplifies the structure and facilitates a manufacturing process. Moreover, it is not necessary to dispose a plurality of electrodes for the electronic device 110, and thus not necessary to process signals from the plurality of electrodes. The plurality of electrodes may be disposed on the pressure sensor 20 in order to add a function.

In this embodiment, the pressure sensor having the piezoelectric film has been illustrated as an example of a detection unit, but other pressure sensors may be adopted as long as the sensor can provide different outputs depending on how the front panel is expanded or contracted. For example, the detection unit of the present invention can be archived using a strain sensor or an optical sensor.

In this embodiment, the arrangement of the plurality of second electrodes along the Y-axis direction has been illustrated, but the arrangement is not limited to this. Alternatively, one second electrode may be provided and a plurality of first electrodes may be arranged along the Y-axis direction to obtain the same effect. Alternatively, electrodes can be arranged along the X-axis direction instead of the Y-axis direction. In this case, the pressing operation can be detected on the end in the Y-axis direction without providing a physical switch.

Finally, the description of the embodiments is to be considered in all respects as illustrative and not restrictive. The scope of the present invention shall be indicated by the claims, not by the embodiments described above. Furthermore, the scope of the present invention includes the scope equivalent to the claims.

DESCRIPTION OF REFERENCE SYMBOLS

10: Piezoelectric film
11: First electrode
12: Second electrode
20, 50: Pressure sensor
100, 200, 300: Electronic device
102, 302: Housing
105: Flat part
106: Curved part

The invention claimed is:

1. A pressure sensor comprising:
a piezoelectric film having a flat part and a curved part in an initial state without an externally applied force, and does not generate a charge in the initial state, and the piezoelectric film having opposed first and second main surfaces; and
a first electrode on the first main surfaces of the piezoelectric film; and
a second electrode on the second main surfaces of the piezoelectric film, wherein
when the flat part receives a pressing operation a first output is generated, and when the curved part receives a pressing operation a second output is generated, the first output being different than the second output, and
the curved part includes a first curved part and a second curved part that are respectively disposed on each of opposed ends of the flat part that face each other such that the flat part is between the first curved part and the second curved part, and the first curved part and the second curved part curve in the same direction relative to the flat part.

2. The pressure sensor according to claim 1, wherein the first output and the second output have different polarities.

3. The pressure sensor according to claim 2, wherein the piezoelectric film includes a chiral polymer.

4. The pressure sensor according to claim 3, wherein the chiral polymer is selected from uniaxially stretched polylactic acid and poly-L-lactic acid.

5. The pressure sensor according to claim 4, wherein the chiral polymer is uniaxially stretched polylactic acid, and the uniaxial stretching direction is at an angle of substantially 45° with respect to a direction of curvature of the curved part.

6. The pressure sensor according to claim 1, wherein the curved part extends continuously around the flat part.

7. The pressure sensor according to claim 1, wherein at least one of the first electrode and the second electrode includes a plurality of electrodes.

8. The pressure sensor according to claim 7, wherein the plurality of electrodes are located on the first main surface of the piezoelectric film and along the curved part of the piezoelectric film.

9. The pressure sensor according to claim 8, wherein the plurality of electrodes are spaced apart along a length of the curved part of the piezoelectric film, the piezoelectric film includes a uniaxially stretched chiral polymer, and a uniaxial stretching direction thereof extends along the length of the curved part.

10. The pressure sensor according to claim 7, wherein the plurality of electrodes include a first set of electrodes located on the first main surface of the piezoelectric film and along the first curved part of the piezoelectric film and a second set of electrodes located on the first main surface of the piezoelectric film and along the second curved part of the piezoelectric film.

11. The pressure sensor according to claim 10, wherein the first set of electrodes are spaced apart along a length of the first curved part of the piezoelectric film, the second set of electrodes are spaced apart along a length of the second curved part of the piezoelectric film, the piezoelectric film includes a uniaxially stretched chiral polymer, and a uniaxial stretching direction thereof extends along the length of the first curved part.

12. An electronic device comprising:
a housing defining an open surface;

a panel having a flat part and a curved part located within the open surface of the housing; and the pressure sensor according to claim 1 adjacent the panel such that the curved part of the piezoelectric film is adjacent the curved part of the panel and the flat part of the piezoelectric film is adjacent the flat part of the panel.

13. The electronic device according to claim 12, further comprising a capacitive sensor adjacent the panel.

14. The electronic device according to claim 13, wherein the capacitive sensor is located between the pressure sensor and the panel.

\* \* \* \* \*